(12) United States Patent
Liu et al.

(10) Patent No.: US 8,870,416 B2
(45) Date of Patent: Oct. 28, 2014

(54) LED PACKAGE STRUCTURE HAVING A LIGHT-PROJECTING ANGLE ADJUSTING FUNCTION

(75) Inventors: Chia-Chi Liu, Taipei (TW); Kao-Hsu Chou, Taipei (TW)

(73) Assignee: Lustrous Technology Ltd., New Taipei (TW)

( * ) Notice: Subject to any disclaimer, the term of this patent is extended or adjusted under 35 U.S.C. 154(b) by 159 days.

(21) Appl. No.: 13/589,146

(22) Filed: Aug. 19, 2012

(65) Prior Publication Data
US 2014/0049966 A1 Feb. 20, 2014

(51) Int. Cl.
| F21V 14/06 | (2006.01) |
| F21V 5/04 | (2006.01) |
| H01L 33/58 | (2010.01) |
| G02B 1/06 | (2006.01) |
| F21S 10/00 | (2006.01) |
| H01L 27/146 | (2006.01) |
| G02B 26/00 | (2006.01) |

(52) U.S. Cl.
CPC ............... F21V 14/06 (2013.01); *F21S 10/002* (2013.01); *H01L 33/58* (2013.01); *H01L 27/14625* (2013.01); *G02B 26/004* (2013.01)
USPC ........... 362/278; 362/286; 362/318; 362/320; 257/E33.073; 359/666

(58) Field of Classification Search
CPC ......... F21V 19/02; F21V 14/06; F21V 17/02; F21V 7/16; F21V 17/164; F21V 14/00; H01L 33/58; H01L 33/54; H01L 31/0232; H01L 27/14625; G02B 3/14; G02B 26/004; G02B 13/009; G02B 19/0066; G02B 26/02; F21S 10/002; F21S 48/1731; F21S 48/325; H04N 9/3155; F21Y 2101/02; F21Y 2113/005

USPC ......... 362/277, 278, 284, 286, 287, 318, 319, 362/320, 324; 257/98, E33.068, E33.073; 359/666

See application file for complete search history.

(56) References Cited

U.S. PATENT DOCUMENTS

| 7,114,832 B2* | 10/2006 | Holder et al. ................. 362/308 |
| 7,344,279 B2* | 3/2008 | Mueller et al. ................ 362/294 |
| 7,378,792 B2* | 5/2008 | Huang et al. .................. 313/512 |
| 7,538,830 B2* | 5/2009 | Sasuga ............................ 349/57 |
| 8,456,107 B2* | 6/2013 | Salm .............................. 315/307 |
| 2008/0266893 A1* | 10/2008 | Speier ........................... 362/551 |
| 2011/0317286 A1* | 12/2011 | Drost et al. ................... 359/798 |

* cited by examiner

*Primary Examiner* — Alan Cariaso
(74) *Attorney, Agent, or Firm* — Li & Cai Intellectual Property (USA) Office

(57) ABSTRACT

A LED package structure includes a substrate unit, a light-emitting unit, a support unit, a lens unit, an input unit and a control unit. The light-emitting unit includes at least one light-emitting element electrically connected to the substrate unit. The support unit includes a support element disposed on the substrate unit and surrounding the light-emitting element. The lens unit includes an electrically-controlled zoom lens disposed above the light-emitting element and retained by the support element. The input unit includes a signal input module for providing a predetermined voltage signal. The control unit includes a voltage controlling module electrically connected between the electrically-controlled zoom lens and the signal input module. Therefore, the voltage controlling module provides a predetermined voltage value for the electrically-controlled zoom lens according to the predetermined voltage signal, and the variable focal length of the electrically-controlled zoom lens is adjusted according to the predetermined voltage value.

6 Claims, 7 Drawing Sheets

LED PACKAGE STRUCTURE HAVING A LIGHT-PROJECTING ANGLE ADJUSTING FUNCTION

BACKGROUND OF THE INVENTION

1. Field of the Invention

The instant disclosure relates to a LED package structure, and more particularly to a LED package structure having a light-projecting angle adjusting function.

2. Description of Related Art

The invention of the lamp greatly changed the style of building construction and the lifestyle of human beings, allowing people to work during the night. Traditional lighting devices such as lamps that adopt incandescent bulbs, fluorescent bulbs, or power-saving bulbs have been generally well-developed and used intensively for indoor illumination.

Moreover, compared to the newly developed light-emitting-diode (LED) lamp using a LED package structure, these traditional lamps have the disadvantages of quick attenuation, high power consumption, high heat generation, short service life, high fragility, and being not recyclable. Thus, various high-powered LED lamps using LED package structures are created to replace the traditional lighting devices.

SUMMARY OF THE INVENTION

One aspect of the instant disclosure relates to a LED package structure having a light-projecting angle adjusting function.

One of the embodiments of the instant disclosure provides a LED package structure having a light-projecting angle adjusting function, comprising: a substrate unit, a light-emitting unit, a support unit, a lens unit, an input unit and a control unit. The substrate unit includes a substrate body. The light-emitting unit includes at least one light-emitting element disposed on the substrate body and electrically connected to the substrate body. The support unit includes a support element disposed on the substrate body and surrounding the at least one light-emitting element. The lens unit includes an electrically-controlled zoom lens disposed above the at least one light-emitting element and retained by the support element, wherein the electrically-controlled zoom lens has a variable focal length, and light beams generated by the at least one light-emitting element pass through the electrically-controlled zoom lens to form a projection light source. The input unit includes a signal input module for providing a predetermined voltage signal. The control unit includes a voltage controlling module electrically connected between the electrically-controlled zoom lens and the signal input module, wherein the voltage controlling module provides a predetermined voltage value for the electrically-controlled zoom lens according to the predetermined voltage signal provided by the signal input module, and the variable focal length of the electrically-controlled zoom lens is adjusted according to the predetermined voltage value provided by the voltage controlling module.

More precisely, the signal input module includes a signal input panel and a signal transmission line electrically connected to the voltage controlling module, and the predetermined voltage signal provided by the signal input module is transmitted to the voltage control module through the signal transmission line of the signal input module.

Another one of the embodiments of the instant disclosure provides a LED package structure having a light-projecting angle adjusting function, comprising: a substrate unit, a light-emitting unit, a support unit, a lens unit, an input unit and a control unit. The substrate unit includes a substrate body. The light-emitting unit includes at least one light-emitting element disposed on the substrate body and electrically connected to the substrate body. The support unit includes a support element disposed on the substrate body and surrounding the at least one light-emitting element. The lens unit includes an electrically-controlled zoom lens disposed above the at least one light-emitting element and retained by the support element, wherein the electrically-controlled zoom lens has a variable focal length, and light beams generated by the at least one light-emitting element pass through the electrically-controlled zoom lens to form a projection light source. The input unit includes a wireless receiver, a signal input module for providing a predetermined voltage signal, and a wireless transmitter disposed inside the signal input module and corresponding to the wireless receiver, wherein the predetermined voltage signal provided by the signal input module is wirelessly transmitted to the wireless receiver through the wireless transmitter. The control unit includes a voltage controlling module electrically connected between the electrically-controlled zoom lens and the wireless receiver, wherein the voltage controlling module provides a predetermined voltage value for the electrically-controlled zoom lens according to the predetermined voltage signal received by the wireless receiver, and the variable focal length of the electrically-controlled zoom lens is adjusted according to the predetermined voltage value provided by the voltage controlling module.

More precisely, the signal input module includes a signal input panel, the wireless receiver includes a signal transmission line electrically connected to the voltage controlling module, and the predetermined voltage signal received by the wireless receiver is transmitted to the voltage control module through the signal transmission line of the wireless receiver.

Yet another one of the embodiments of the instant disclosure provides a LED package structure having a light-projecting angle adjusting function, comprising: a substrate unit, a light-emitting unit, a support unit, a lens unit, a first input unit, a second input unit and a control unit. The substrate unit includes a substrate body. The light-emitting unit includes at least one light-emitting element disposed on the substrate body and electrically connected to the substrate body. The support unit includes a support element disposed on the substrate body and surrounding the at least one light-emitting element. The lens unit includes an electrically-controlled zoom lens disposed above the at least one light-emitting element and retained by the support element, wherein the electrically-controlled zoom lens has a variable focal length, and light beams generated by the at least one light-emitting element pass through the electrically-controlled zoom lens to form a projection light source. The first input unit includes a first signal input module for providing a first predetermined voltage signal. The second input unit includes a wireless receiver, a second signal input module for providing a second predetermined voltage signal, and a wireless transmitter disposed inside the second signal input module and corresponding to the wireless receiver, wherein the second predetermined voltage signal provided by the second signal input module is wirelessly transmitted to the wireless receiver through the wireless transmitter. The control unit includes a voltage controlling module electrically connected between the electrically-controlled zoom lens and the first signal input module and electrically connected between the electrically-controlled zoom lens and the wireless receiver, wherein the voltage controlling module provides a predetermined voltage value for the electrically-controlled zoom lens according to the first predetermined voltage signal provided by the first signal input module or according to the second predetermined voltage signal received by the wireless receiver, and the variable focal length of the electrically-controlled zoom lens is adjusted according to the predetermined voltage value provided by the voltage controlling module.

More precisely, wherein the first signal input module includes a first signal input panel and a first signal transmission line electrically connected to the voltage controlling module, and the first predetermined voltage signal provided by the first signal input module is transmitted to the voltage control module through the first signal transmission line of the first signal input module, wherein the second signal input module includes a second signal input panel, the wireless receiver includes a second signal transmission line electrically connected to the voltage controlling module, and the second predetermined voltage signal received by the wireless receiver is transmitted to the voltage control module through the second signal transmission line of the wireless receiver.

More precisely, the electrically-controlled zoom lens is a liquid lens having a variable lens curvature, and the liquid lens includes two voltage input electrodes electrically connected to the voltage controlling module, wherein the predetermined voltage value provided by the voltage controlling module is transmitted to the liquid lens through the two voltage input electrodes, and the variable lens curvature of the liquid lens is adjusted according to the predetermined voltage value provided by the voltage controlling module.

Therefore, when the light beams generated by the at least one light-emitting element pass through the electrically-controlled zoom lens to form the projection light source, the light-emitting angle and the light-projecting distance (i.e., the outermost light-projecting distance) of the projection light source can be adjusted according to different predetermined voltage values. More precisely, it is very easy for a user to adjust the light-emitting angle and the light-projecting distance of the projection light source by controlling the signal input panel (i.e., the first signal input panel) or by wirelessly controlling the signal input panel (i.e., the second signal input panel).

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

First Embodiment

Figure 1A:
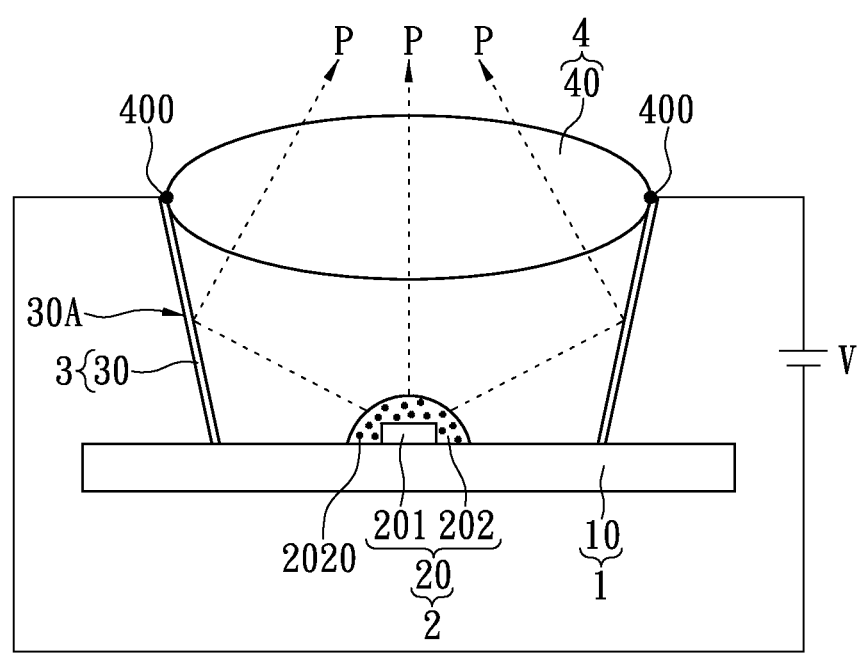
FIG. 1A shows a lateral, schematic view of the LED package structure using the hollow reflective cover according to the first embodiment of the instant disclosure.
Figure 1B:
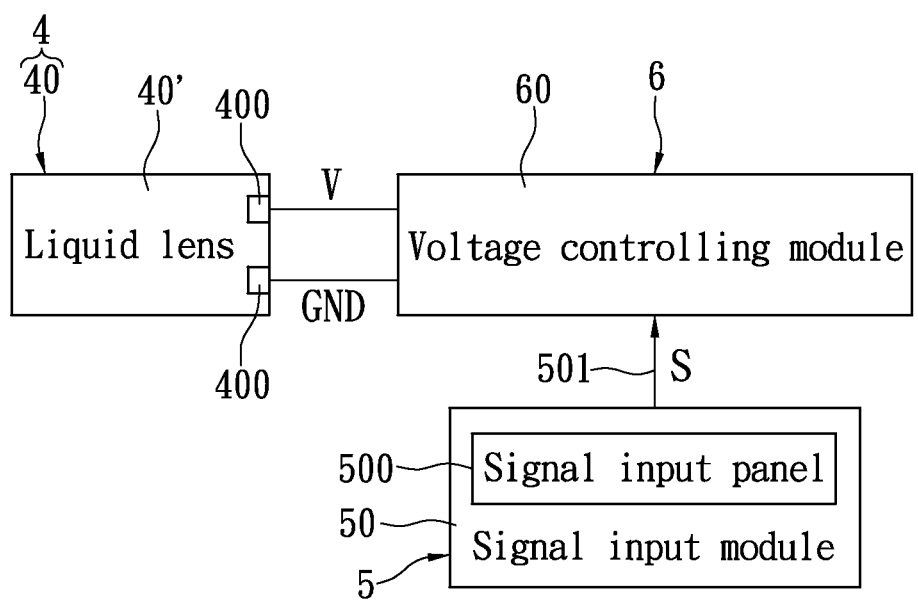
FIG. 1B shows a function block diagram of the LED package structure having a light-projecting angle adjusting function according to the first embodiment of the instant disclosure.

Referring to FIG. 1A and FIG. 1B, where FIG. 1A is a lateral, schematic diagram and FIG. 1B is a function block diagram. The first embodiment of the instant disclosure provides a LED package structure having a light-projecting angle adjusting function, comprising: a substrate unit 1, a light-emitting unit 2, a support unit 3, a lens unit 4, an input unit 5 and a control unit 6.

First, the substrate unit 1 includes a substrate body 10. For example, the substrate body 10 may be a circuit substrate, and the circuit substrate has a plurality of conductive traces (not shown) formed thereon.

Moreover, the light-emitting unit 2 includes at least one light-emitting element 20 disposed on the substrate body 10 and electrically connected to the substrate body 10, and the light-emitting element 20 may be a light-emitting diode or a laser diode. For example, the light-emitting element 2 includes at least one LED chip 201 disposed on the substrate body 10 and electrically connected to the substrate body 10 by a wire-bonding process and a package resin body 202 disposed on the substrate body 10 to enclose the at least one LED chip 201. More precisely, the at least one LED chip 201 may be a blue LED bare chip for generating blue light sources, and the package resin body 202 may be a phosphor resin body formed by mixing a plurality of phosphor particles 2020 and silicone or by mixing a plurality of phosphor particles 2020 and epoxy. Of course, the first embodiment can use a plurality of LED chips 201 disposed on the substrate body 10 and electrically connected to the substrate body 10.

It is worth mentioning that the instant disclosure can omit the phosphor particles 2020 from the package resin body 202, thus the package resin body 202 may be a transparent resin body formed by silicone or epoxy. Hence, the package resin body 202 may be one of the phosphor resin body and the transparent resin body according to different requirements. However, the above-mentioned design for the light-emitting element 20 of the first embodiment is merely an example and is not meant to limit the instant disclosure.

Furthermore, the support unit 3 includes a support element 30 (such as a holder) disposed on the substrate body 10 and surrounding the light-emitting element 20. For example, the support element 30 may be a hollow reflective cover 30A, thus the light-condensing effect of the light beams L generated by the light-emitting element 20 can be increased by using the hollow reflective cover 30A.

In addition, the lens unit 4 includes an electrically-controlled zoom lens 40 disposed above the light-emitting element 20 and retained (or positioned) by the support element 30, and the electrically-controlled zoom lens 40 has a variable focal length that can be adjusted according to different voltage values. The input unit 5 includes a signal input module 50 for providing a predetermined voltage signal S. The control unit 6 includes a voltage controlling module 60 electrically connected between the electrically-controlled zoom lens 40 and the signal input module 50. Besides, the voltage controlling module 60 can provide a predetermined voltage value V for (or to) the electrically-controlled zoom lens 40 according to the predetermined voltage signal S provided by the signal input module 50, and the variable focal length of the electrically-controlled zoom lens 40 can be adjusted according to the predetermined voltage value V provided by the voltage controlling module 60. Therefore, when the light beams L generated by the light-emitting element 20 pass through the electrically-controlled zoom lens 40 to form a projection light source P, the light-emitting angle and the light-projecting distance (i.e., the outermost light-projecting distance) of the projection light source P can be adjusted according to different predetermined voltage values V.

For example, the electrically-controlled zoom lens 40 may be a liquid lens 40' having a variable lens curvature, and the liquid lens 40' includes two voltage input electrodes 400 electrically connected to the voltage controlling module 60. The predetermined voltage value V provided by the voltage controlling module 60 can be transmitted to the liquid lens 40' through the two voltage input electrodes 400, and the variable lens curvature of the liquid lens 40' can be adjusted according to the predetermined voltage value V provided by the voltage controlling module 60. In addition, the signal input module 50 includes a signal input panel 500 for a user to input command signals and a signal transmission line 501 electrically connected to the voltage controlling module 60, and the predetermined voltage signal S provided by the signal input module 50 can be transmitted to the voltage control module 60 through the signal transmission line 501 of the signal input module 50. Therefore, it is very easy for a user to adjust the light-emitting angle and the light-projecting distance of the projection light source P by controlling or operating the signal input panel 500.

Figure 1C:
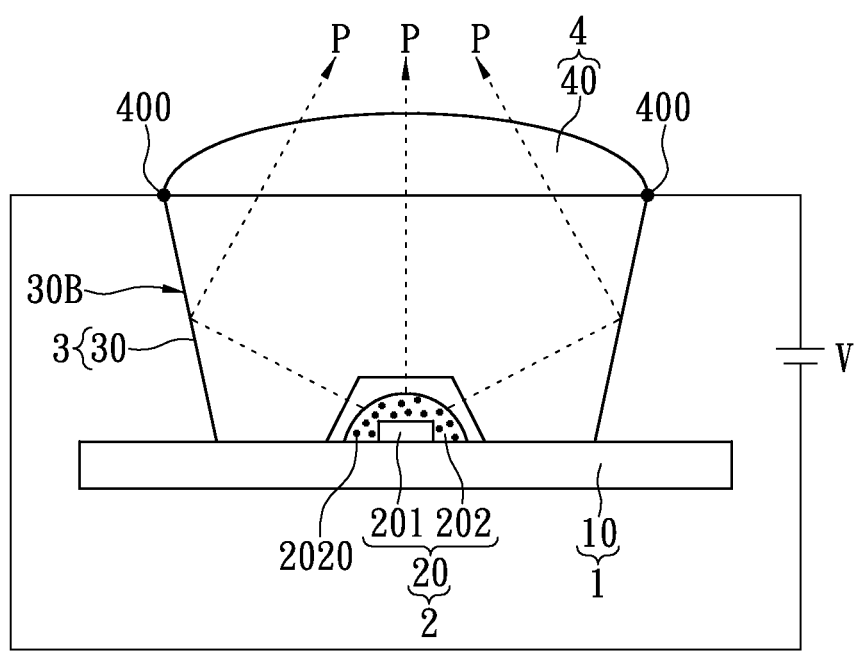
FIG. 1C shows a lateral, schematic view of the LED package structure using the solid collimator according to the first embodiment of the instant disclosure.

Referring to FIG. 1C, the hollow reflective cover 30A shown in FIG. 1A can be replaced by a solid collimator 30B shown in FIG. 1C, thus the light-condensing effect of the light beams L generated by the light-emitting element 20 also can be increased by using the solid collimator 30B. In other words, in this embodiment, the support element 30 may be one of the hollow reflective cover 30A and the solid collimator 30B according to different requirements. However, the above-mentioned design for the support element 30 of the first embodiment is merely an example and is not meant to limit the instant disclosure.

Figure 1D:
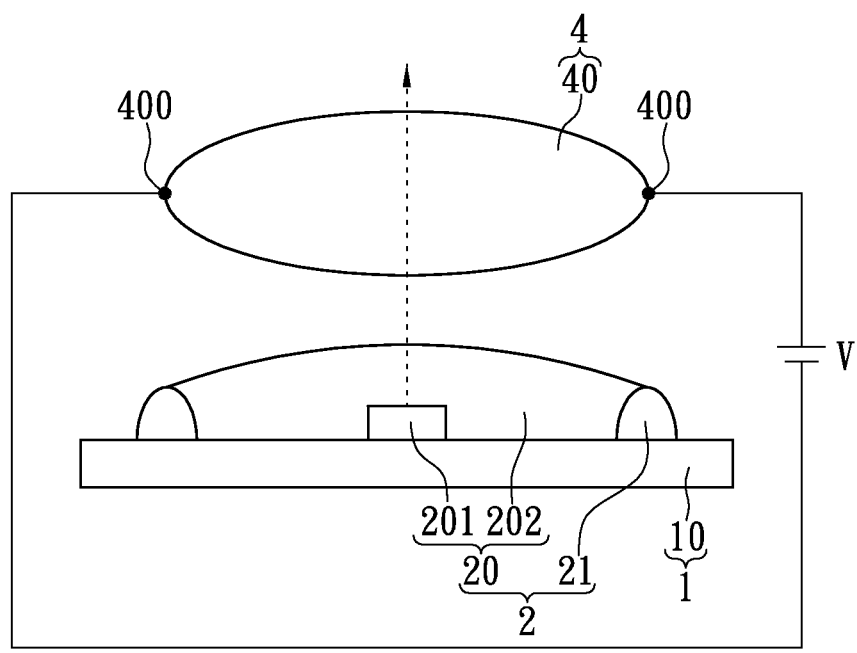
FIG. 1D shows a lateral, schematic view of the LED package structure using a COB type LED according to the first embodiment of the instant disclosure.

FIG. 1D shows a lateral, schematic view of the LED package structure using a COB type LED according to the first embodiment of the instant disclosure. The light-emitting unit 2 may be a COB (Chip On Board) type LED. More precisely, the light-emitting unit 2 includes a surrounding light-reflecting dam 21 disposed on the substrate body 10 to surround the LED chip 201 and the package resin body 202, where the position of the package resin body 202 is limited through the surrounding light-reflecting dam 21, and the inner surface of the surrounding light-reflecting dam 21 can contact the external peripheral surface of the package resin body 202.

Figure 1E:
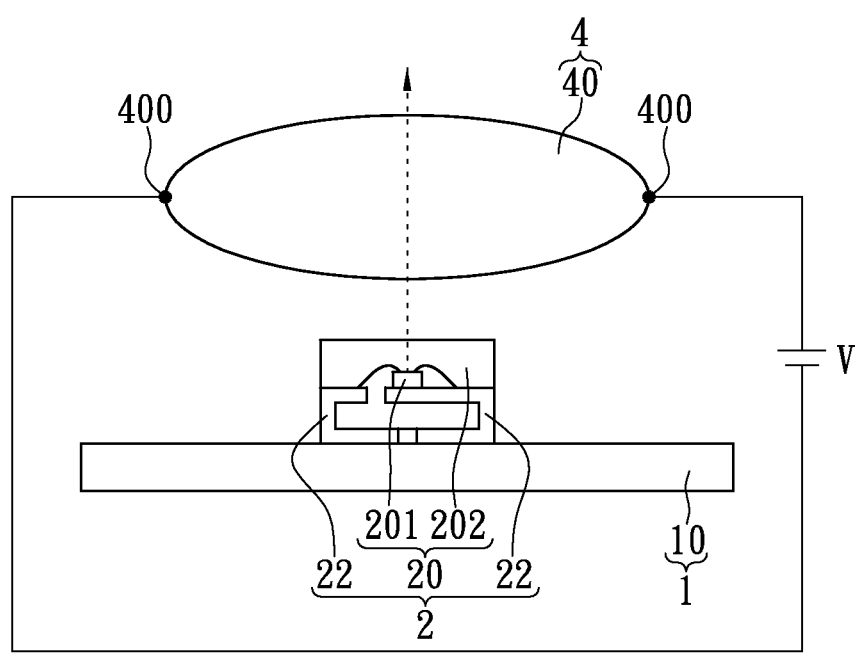
FIG. 1E shows a lateral, schematic view of the LED package structure using a SMD type LED according to the first embodiment of the instant disclosure.

FIG. 1E shows a lateral, schematic view of the LED package structure using SMD type LED according to the first embodiment of the instant disclosure. The light-emitting unit 2 may be a SMD (Surface Mount Device) type LED. More precisely, the light-emitting unit 2 includes at least two conductive lead frames 22 electrically contacting the substrate body 10, where the package resin body 202 is used to connect the two conductive lead frames 22 for fixing the relative relationship between the two conductive lead frames 22, and the LED chip 201 is disposed on one of the two conductive lead frames 22 and electrically connected between the two conductive lead frames 22 by wire-bonding.

Second Embodiment

Figure 2:
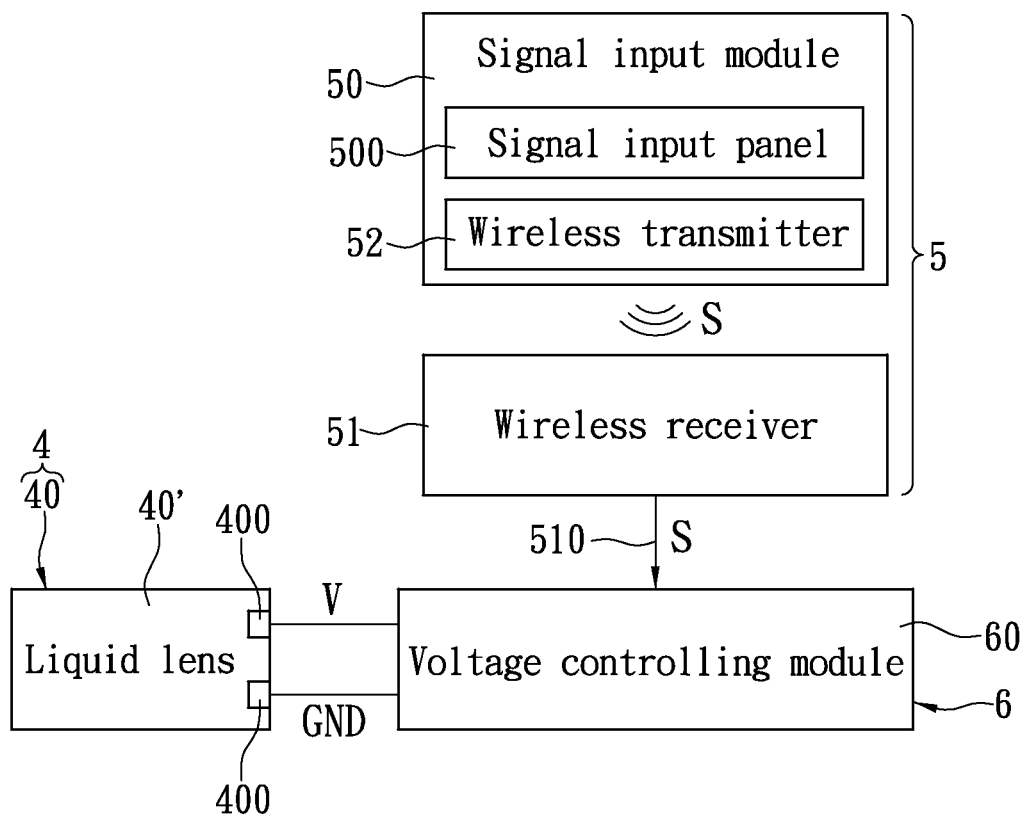
FIG. 2 shows a function block diagram of the LED package structure having a light-projecting angle adjusting function according to the second embodiment of the instant disclosure.

Referring to FIG. 2, where the second embodiment of the instant disclosure provides a LED package structure having a light-projecting angle adjusting function, comprising: a substrate unit (not shown), a light-emitting unit (not shown), a support unit (not shown), a lens unit 4, an input unit 5 and a control unit 6. Comparing FIG. 2 with FIG. 1B, the difference between the second embodiment and the first embodiment is as follows: in the second embodiment, the input unit 5 includes a wireless receiver 51, a signal input module 50 for providing a predetermined voltage signal S, and a wireless transmitter 52 disposed inside the signal input module 50 and corresponding to the wireless receiver 51, and the predetermined voltage signal S provided by the signal input module 50 can be wirelessly transmitted to the wireless receiver 51 through the wireless transmitter 52. In addition, the control unit 6 includes a voltage controlling module 60 electrically connected between the electrically-controlled zoom lens 40 and the wireless receiver 51. The voltage controlling module 60 can provide a predetermined voltage value V for (or to) the electrically-controlled zoom lens 40 according to the predetermined voltage signal S received by the wireless receiver 51 (i.e., according to the predetermined voltage signal S provided by the signal input module 50), and the variable focal length of the electrically-controlled zoom lens 40 can be adjusted according to the predetermined voltage value V provided by the voltage controlling module 60. Therefore, when the light beams (not shown) generated by the light-emitting element 20 pass through the electrically-controlled zoom lens 40 to form a projection light source (not shown), the light-emitting angle and the light-projecting distance (i.e., the outermost light-projecting distance) of the projection light source (not shown) can be adjusted according to different predetermined voltage values V.

For example, the electrically-controlled zoom lens 40 may be a liquid lens 40' having a variable lens curvature, and the liquid lens 40' includes two voltage input electrodes 400 electrically connected to the voltage controlling module 60. The predetermined voltage value V provided by the voltage controlling module 60 can be transmitted to the liquid lens 40' through the two voltage input electrodes 400, and the variable lens curvature of the liquid lens 40' can be adjusted according to the predetermined voltage value V provided by the voltage controlling module 60. In addition, the signal input module 50 includes a signal input panel 500, the wireless receiver 51 includes a signal transmission line 510 electrically connected to the voltage controlling module 60, and the predetermined voltage signal S received by the wireless receiver 51 can be transmitted to the voltage control module 60 through the signal transmission line 510 of the wireless receiver 51. Therefore, it is very easy for a user to adjust the light-emitting angle and the light-projecting distance of the projection light source (not shown) by wirelessly controlling or operating the signal input panel 500.

Third Embodiment

Figure 3:
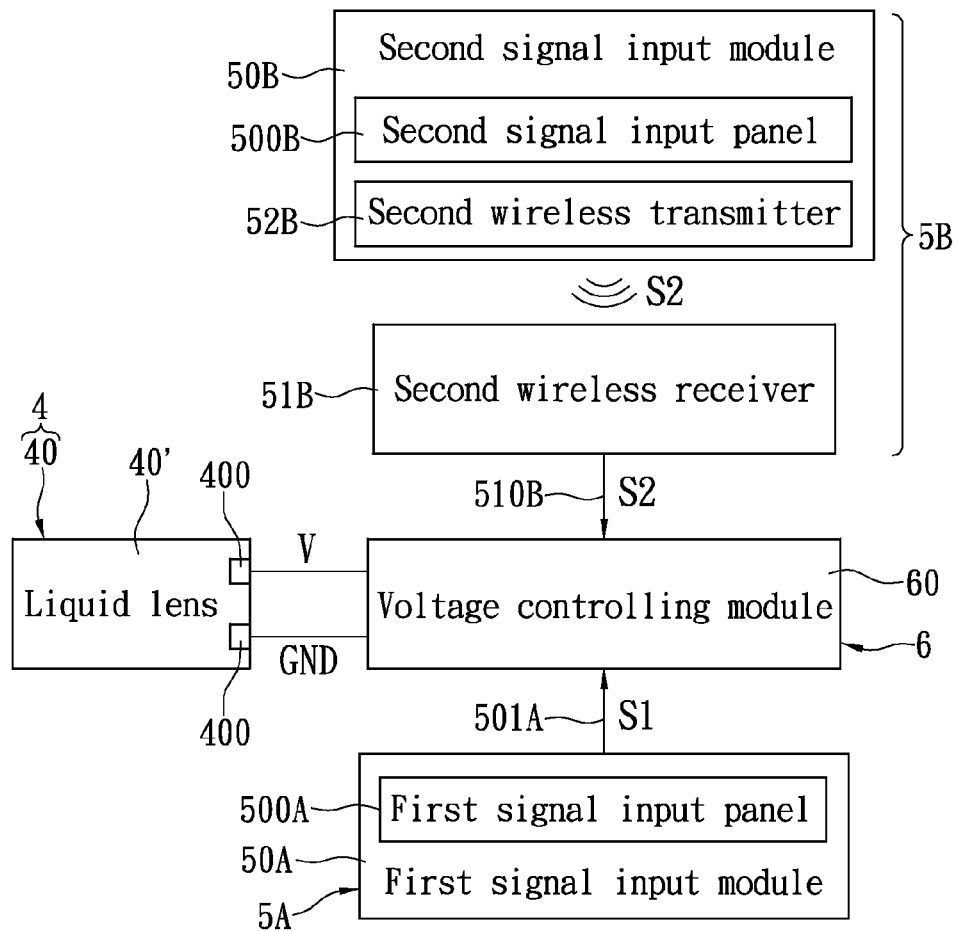
FIG. 3 shows a function block diagram of the LED package structure having a light-projecting angle adjusting function according to the third embodiment of the instant disclosure.

Referring to FIG. 3, where the third embodiment of the instant disclosure provides a LED package structure having a light-projecting angle adjusting function, comprising: a substrate unit (not shown), a light-emitting unit (not shown), a support unit (not shown), a lens unit 4, a first input unit 5A, a second input unit 5B and a control unit 6. Comparing FIG. 3 with FIG. 1B and FIG. 2, the difference between the third embodiment and the first and the second embodiments is as follows: in the third embodiment, the first input unit 5A includes a first signal input module 50A for providing a first predetermined voltage signal S1. In addition, the second input unit 5B includes a wireless receiver 51B, a second signal input module 50B for providing a second predetermined voltage signal S2, and a wireless transmitter 52B disposed inside the second signal input module 50B and corresponding to the wireless receiver 51B, and the second predetermined voltage signal S2 provided by the second signal input module 50B can be wirelessly transmitted to the wireless receiver 51B through the wireless transmitter 52B. Moreover, the control unit 6 includes a voltage controlling module 60 electrically connected between the electrically-controlled zoom lens 40 and the first signal input module 50A and electrically connected between the electrically-controlled zoom lens 40 and the wireless receiver 51B. The voltage controlling module 60 can provide a predetermined voltage value V for (or to) the electrically-controlled zoom lens 40 according to the first predetermined voltage signal S1 provided by the first signal input module 50A or according to the second predetermined voltage signal S2 received by the wireless receiver 51B (i.e., according to the second predetermined voltage signal S2 provided by the second signal input module 50B), and the variable focal length of the electrically-controlled zoom lens 40 can be adjusted according to the predetermined voltage value V provided by the voltage controlling module 60. Therefore, when the light beams (not shown) generated by the light-emitting element 20 pass through the electrically-controlled zoom lens 40 to form a projection light source (not shown), the light-emitting angle and the light-projecting distance (i.e., the outermost light-projecting distance) of the projection light source (not shown) can be adjusted according to different predetermined voltage values V.

For example, the electrically-controlled zoom lens 40 may be a liquid lens 40' having a variable lens curvature, and the liquid lens 40' includes two voltage input electrodes 400 electrically connected to the voltage controlling module 60. The predetermined voltage value V provided by the voltage controlling module 60 can be transmitted to the liquid lens 40' through the two voltage input electrodes 400, and the variable lens curvature of the liquid lens 40' can be adjusted according to the predetermined voltage value V provided by the voltage controlling module 60. In addition, the first signal input module 50A includes a first signal input panel 500A and a first signal transmission line 501A electrically connected to the voltage controlling module 60, and the first predetermined voltage signal S1 provided by the first signal input module 50A can be transmitted to the voltage control module 60 through the first signal transmission line 501A of the first signal input module 50A. Furthermore, the second signal input module 50B includes a second signal input panel 500B, the wireless receiver 51B includes a second signal transmission line 510B electrically connected to the voltage controlling module 60, and the second predetermined voltage signal S2 received by the wireless receiver 51B can be transmitted to the voltage control module 60 through the second signal transmission line 510B of the wireless receiver 51B. Therefore, it is very easy for a user to adjust the light-emitting angle and the light-projecting distance of the projection light source (not shown) by operating the first signal input panel 500A or wirelessly operating the second signal input panel 500B according to different requirements.

In conclusion, when the light beams L generated by the light-emitting element 20 pass through the electrically-controlled zoom lens 40 to form the projection light source P, the light-emitting angle and the light-projecting distance (i.e., the outermost light-projecting distance) of the projection light source P can be adjusted according to different predetermined voltage values V. More precisely, it is very easy for a user to adjust the light-emitting angle and the light-projecting distance of the projection light source P by controlling the signal input panel 500 of the first embodiment (i.e., the first signal input panel 500A of the third embodiment) or by wirelessly controlling the signal input panel 500 of the second embodiment (i.e., the second signal input panel 500B of the third embodiment).

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A LED package structure having a light-projecting angle adjusting function, comprising:
    a substrate unit including a substrate body;
    a light-emitting unit including at least one light-emitting element disposed on the substrate body and electrically connected to the substrate body;
    a support unit including a support element disposed on the substrate body and surrounding the at least one light-emitting element;
    a lens unit including an electrically-controlled zoom lens disposed above the at least one light-emitting element and retained by the support element, wherein the electrically-controlled zoom lens has a variable focal length, and light beams generated by the at least one light-emitting element pass through the electrically-controlled zoom lens to form a projection light source;
    a first input unit including a first signal input module for providing a first predetermined voltage signal;
    a second input unit including a wireless receiver, a second signal input module for providing a second predetermined voltage signal, and a wireless transmitter disposed inside the second signal input module and corresponding to the wireless receiver, wherein the second predetermined voltage signal provided by the second signal input module is wirelessly transmitted to the wireless receiver through the wireless transmitter; and
    a control unit including a voltage controlling module electrically connected between the electrically-controlled zoom lens and the first signal input module and electrically connected between the electrically-controlled zoom lens and the wireless receiver, wherein the voltage controlling module provides a predetermined voltage value for the electrically-controlled zoom lens according to the first predetermined voltage signal provided by the first signal input module or according to the second predetermined voltage signal received by the wireless receiver, and the variable focal length of the electrically-controlled zoom lens is adjusted according to the predetermined voltage value provided by the voltage controlling module.

2. The LED package structure of claim 1, wherein the at least one light-emitting element includes at least one LED chip disposed on the substrate body and electrically connected to the substrate body and a package resin body disposed on the substrate body to enclose the at least one LED chip.

3. The LED package structure of claim 2, wherein the package resin body is a transparent resin body formed by one of silicone and epoxy or the package resin body is a phosphor resin body formed by mixing a plurality of phosphor particles and one of silicone and epoxy.

4. The LED package structure of claim 1, wherein the at least one light-emitting element is a light-emitting diode or a laser diode.

5. The LED package structure of claim 1, wherein the support element is one of a hollow reflective cover and a solid collimator, wherein the first signal input module includes a first signal input panel and a first signal transmission line electrically connected to the voltage controlling module, and the first predetermined voltage signal provided by the first signal input module is transmitted to the voltage control module through the first signal transmission line of the first signal input module, wherein the second signal input module includes a second signal input panel, the wireless receiver includes a second signal transmission line electrically connected to the voltage controlling module, and the second predetermined voltage signal received by the wireless receiver is transmitted to the voltage control module through the second signal transmission line of the wireless receiver.

6. The LED package structure of claim 1, wherein the electrically-controlled zoom lens is a liquid lens having a variable lens curvature, and the liquid lens includes two voltage input electrodes electrically connected to the voltage controlling module, wherein the predetermined voltage value provided by the voltage controlling module is transmitted to the liquid lens through the two voltage input electrodes, and the variable lens curvature of the liquid lens is adjusted according to the predetermined voltage value provided by the voltage controlling module.

* * * * *